United States Patent
Li et al.

(10) Patent No.: US 6,539,341 B1
(45) Date of Patent: Mar. 25, 2003

(54) METHOD AND APPARATUS FOR LOG INFORMATION MANAGEMENT AND REPORTING

(75) Inventors: Weimin Li, Tracy, CA (US); Sajid Hussain, Santa Clara, CA (US); Andrew Nakao, Fremont, CA (US); Vikas Khandelwal, Santa Clara, CA (US)

(73) Assignee: 3Com Corporation, Santa Clara, CA (US)

(*) Notice: Subject to any disclaimer, the term of this patent is extended or adjusted under 35 U.S.C. 154(b) by 44 days.

(21) Appl. No.: 09/706,947

(22) Filed: Nov. 6, 2000

(51) Int. Cl.[7] .................................................. G06F 3/00
(52) U.S. Cl. ...................... 702/187; 702/182; 702/183; 702/184; 702/185; 702/186
(58) Field of Search ................................ 702/183, 123, 702/91, 184, 185, 186, 187

(56) References Cited

U.S. PATENT DOCUMENTS 5,402,361 A * 3/1995 Peterson et al. ............ 364/525
5,790,427 A * 8/1998 Greer et al. ................ 364/556
5,839,094 A * 11/1998 French ......................... 702/91
6,002,992 A * 12/1999 Pauwels et al. ............. 702/123

* cited by examiner

Primary Examiner—Marc S. Hoff
Assistant Examiner—Felix Suarez
(74) Attorney, Agent, or Firm—Crosby, Heafey, Roach & May; John W. Carpenter

(57) ABSTRACT

Log entries in a system that produces status or other log data (ASIC verification system, for example) are saved in a circular buffer until a trigger event occurs. Typically, the system operates on a Device Under Test (DUT), but may apply to other systems that simply monitor or gather information. When the trigger occurs, a window of the saved log entries are saved to disk. A level of granularity of the reporting for the log entries is set at any point between low level (cycle based) reporting (recording every event) to high level functional descriptions of the processes or activities performed by the system, DUT, or other item being monitored. Log data from various modules of the system are grouped together to provide a logical view of the recorded log entries.

13 Claims, 10 Drawing Sheets

220A — Log File 1

. . . .
AAAAAA
AAAAAB
AAAAAD
AAAAAF
AAAACF
AAAADF
AAAAFF
AAABFF

220B — Log File 2

. . . .
00010
00100
00111
00111
00000
00001
00011
00100
00101

210C 220C
Log File n

⋮ ⋮

| | |
|---|---|
| 09:59:57 | |
| 09:59:58 | XXY |
| 09:59:59 | XXZ |
| 10:00:00 | |
| 10:00:01 | XYY |
| 10:00:02 | |
| 10:00:03 | XZX |
| 10:00:04 | XZY |
| 10:00:05 | |
| 10:00:06 | YXX |
| 10:00:07 | |
| 10:00:08 | YXZ |
| 10:00:09 | YYX |
| 10:00:10 | YYY |

Fig. 2C

Log File

| | | |
|---|---|---|
| 10:00:00 | LF1 | AAAAAA |
| 10:00:00 | LF2 | 00100 |
| 10:00:01 | LF2 | 00111 |
| 10:00:01 | LF3 | XYY |
| 10:00:02 | LF1 | AAAAAF |
| 10:00:03 | LF3 | XZX |
| 10:00:04 | LF1 | AAAACF |
| 10:00:04 | LF2 | 00111 |
| 10:00:04 | LF3 | XZY |
| 10:00:05 | LF1 | AAAADF |
| 10:00:05 | LF2 | 00000 |

Fig. 4

METHOD AND APPARATUS FOR LOG INFORMATION MANAGEMENT AND REPORTING

BACKGROUND OF THE INVENTION

Field of Invention

This invention relates generally to logging mechanisms. The invention is more specifically related to a logging mechanism for ASIC simulations and other data intensive and/or multi platform logging devices.

Discussion of Background

Electronic design automation ("EDA") is becoming increasingly complicated and time consuming, due in part to the greatly increasing size and complexity of the electronic devices designed by EDA tools. EDA tools include verification systems for general purpose microprocessors as well as custom logic devices including Application Specific Integrated Circuits ("ASICs") Examples of ASICs include nonprogrammable gate arrays, field programmable gate arrays ("FPGAs"), and complex programmable logic devices ("PLDs"or "CPLDs"). The design of even the simplest of these devices typically involves generation of a high level design, logic simulation, generation of a network, timing simulation, etc.

An ASIC verification system enables concurrent simulation of related hardware components (including ASIC under test, simulator of host computer, simulator of network media module and other peripherals). Simulation activity needs to be recorded, and, at least in early simulations, generally, each single activity of simulation needs to be tagged. Activity tagging can be either cycle-based or function-based. By convention, we call all this information on simulation activity, log information. Since cycle-based recording is generally supported by the CAD tools of conventional vendors, it is not included in this discussion. The discussion here focuses on the management of log information that is function-based tagged. Function-based tagged information makes understanding of the simulation more intuitive. This same intuitive understanding is not easily achieved when using cycle-based log information.

Generally, log information is reported and recorded throughout the simulation. Monitoring and recording simulation flow at a functional level plays a vital role in tracing and debugging, although there are a pair of factors that determines the efficiency and cost of a log information mechanism in a verification system.

One of the factors is the granularity of log information, i.e. the frequency of reporting and recording log information. Granularity affects the efficiency of log information mechanism, since the more detail the log information is, the more informative it is. On the other hand, simulation speeds are inversely proportional to the increasing granularity of the log information. Function-based log information can help to locate the occurrence of a bug.

Another factor is disk space and how to properly control the disk volume consumed by recording log information. Disk consumption of a log is especially large in a pseudo random and iterative verification systems, where the system is designed to exhaust the simulation variations by pseudo random or iterative generation of simulation stimuli. For a verification system of medium complexity, the size of a log file for a single component in the verification system can easily reach multi-gigabytes or more.

The most common approach to saving log information is to save the information to a single file. Verification. engineers then search that large file to find verification, error, or other information needed for specific tests or verification. However, when the amount of error (or other data) checking and reporting performed by the system becomes large, the tasks of creating and searching the file are either inefficient in that they are time consuming or cumbersome.

SUMMARY OF THE INVENTION

The present inventors have realized that automated checking and error reporting in an ASIC verification environment generates a detailed but cumbersome log of a simulation performed for the verification, and that the log information related to a particular problem may be contained across multiple modules. The present invention reduces the amount of information in a log by reporting messages related to an error or other trigger event in a window of simulation time near the error or other trigger. The size of the window is programmable depending on the nature of the error, the trigger, or other factors.

In addition, the present invention provides a better logical view of the log information. A synchronized disk save is performed on virtual windows from the various modules that perform the verification operations. Log information from the various windows is saved in the log file in relation to the time that the information is retrieved.

The present inventors have also realized that disk I/O operations in the logging process are time consuming and are slowing progress of the simulation and verification process. The present invention provides a circular memory buffer in which log information is stored. A window of the logged information is maintained in the circular buffer and saved to disk when a trigger is generated (error, for example).

The present invention eliminates side effects of fine granularity associated with log information, freeing verification engineers to collect log information with a necessary level of information. The invention also reduces disk I/O operations to improve speed of testing and regression testing. And, the present invention provides a better logical view of log information by centralizing the log information in a dynamically controlled virtual window.

The present invention may be embodied as a method of collecting log information for a Device Under Test (DUT), comprising the steps of, setting up an environment of operating conditions for the. DUT, applying at least one test stimuli to the DUT, collecting log information from the DUT that results from said environment and the applied test stimuli, and saving the log information in a log information file. The data may be collected from multiple modules, and the saving of log information from the multiple modules is performed synchronously.

The method may be conveniently implemented on a general purpose computer, or networked computers, and the results may be displayed on an output device connected to any of the general purpose, networked computers, or transmitted to a remote device for output or display. The present inventors have determined that, using the techniques described herein, in an ASIC verification environment, at the RTL level, that 80% of the disk space used in conventional verification systems can be saved while still providing enough log information to do adequate diagnosis and error tracking. Disk space savings are higher at the netlist level of verification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is an example log file;

FIG. 2B is an example log file;

FIG. 2C is an example log file;

FIG. 4 is an example of a logical view of log files from different modules;

DESCRIPTION OF THE PREFERRED EMBODIMENTS

Figure 1:
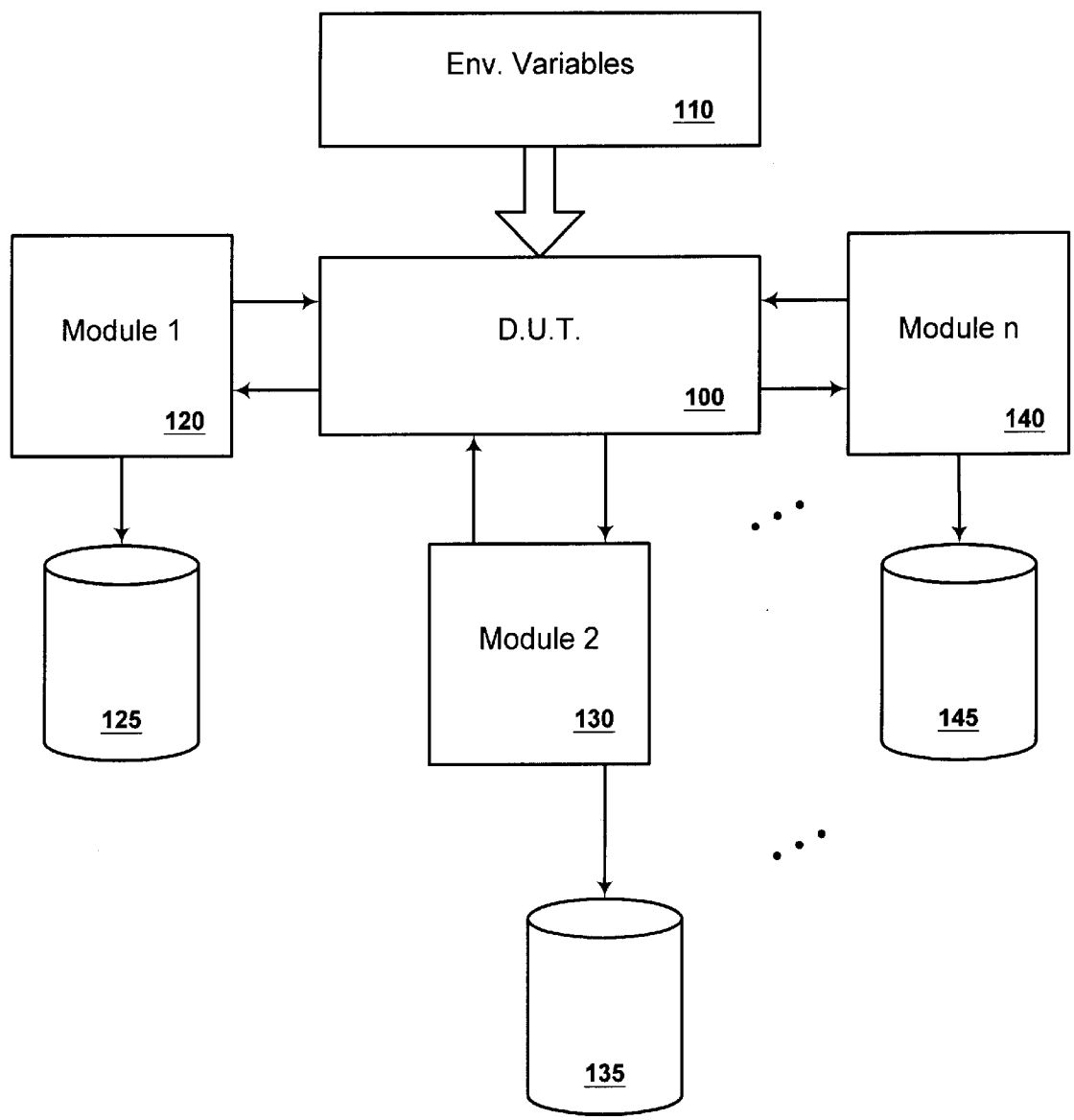
FIG. 1 is a block diagram of a verification environment for a Device Under Test (DUT)

Before proceeding with a discussion of specific details of the invention, a general discussion of verification systems used by the inventors is in order to illustrate the challenge facing the present invention. Currently, verification systems that are used to address log information management in two approaches.

One system, directed test methodology, provides straightforward, simple recording of log information on the base of ASIC functionality. First, information representing different hardware components is recorded into one log file. Second, log information is mostly limited to recording information of simulation flow at a high level of functionality. Lacking file granularity, the log information provides less visibility to underline bugs. As a result, verification engineers using this simulation environment rely heavily on signal-based log information saved through HDL signal recording functionality, and visualized by commercial tools, such as signalscan.

In a second system, a log file mechanism, generally implemented in a pseudo random simulation environment, records function-based log information with fine granularity. It effectively improves the simple mechanism of log information. The highlights of this log file mechanism system include:

(a) Assigned multiple log files such that each log file records log information of one major hardware simulator (module) in the simulation environment. As one example, the PCI host of a PC host simulator might, for example, have three log files: $Log_{13}$ PciHost, Log__PciTx, and Log__PciRx. This separation can record log information in a clear, logical view for any one particular module. And, (b) Log printing code is embedded to record detailed log information on a functional base, which is one level of abstraction higher than the conventional signal-based recording of HDL log information. This log mechanism is effective and more resourceful, aiding verification engineers' debugging. (Note, this log mechanism was not intended to replace signal scan for HDL debug, rather it is designed to help pinpoint the right location of a bug).

However, the detailed log information recording requires a large volume of disk space. The file size of a log file commonly reaches a gigabyte or more for a single module or single data path of one module. The large volume of disk I/O slows down the simulation. Moreover, if the simulator computer is connected to massive storage via a shared corporate network, simulation log information has to travel through the network, and causes stress on the network. Yet in most cases, only a fraction of the log information is used in tracing a single bug. When running a regression of multiple tests, this problem becomes more severe, especially when HDL code is almost stable, and bugs are found much less frequently. This is more than a disk space problem, as more I/O operations mean slower simulation speed. The log mechanism often becomes a bottleneck which slows down the overall speed of simulations during regression testing.

It is useful to contrast the log information mechanism using a single log file to :record log information from all the hardware simulators (modules, PC host, ASIC, and network media, etc.) versus a log mechanism using different log files to record log information from each top-level simulator (module). In the different log file approach, each of the log information entries in each log is tagged with a simulation clock count used to tie the entries together. Another method to correlate the log entries is to cross print (save) some of log information from one log file to other related log file(s). However, either method of correlation is indirect and uncertain since it depends on the users' awareness of all of the log information contained in all log files.

The present invention of log information management and reporting provides a mechanism that addresses this problem, in an effort to:

(a) Eliminate the side effect of fine granularity of log information, so verification engineers can feel free to collect log information with the necessary level of granularity;

b) Reduce the disk I/O operations incurred log information and thus improve simulation speed during regression testing; and c) Provide a better logical view of log information, which centralizes the bug information in a dynamically controlled virtual window.

Referring now to the drawings, wherein like reference numerals designate identical or corresponding parts, and more particularly to FIG. 1 thereof, there is illustrated a block diagram of a verification environment for a Device Under Test (DUT) 100. The DUT 100 is provided with environment variables (example environment variables include operating temperature, V++, ground, etc.) via an environment module 110. Top level modules (test modules, for example), module 1 120, module 2 130, and module n 140, each provide stimuli for any of the processes or functions that may be performed by the DUT, and record outputs or selected internal conditions of the DUT during the simulation. Example top level modules include a transmitter, receiver, and verification modules (see FIG. 5B, for example). Other modules may also be attached (data checker module, message pipe module, etc., for example).

Each top level module may be configured to save outputs and conditions to a log file for review by test engineers. For example, top level module 1 120 records log information to file (not shown) on a disk drive device 125. Each of disk drive devices 125, 135, and 145 may be separate storage devices, or a same storage device with separate file names for each of top level module's log information. In another configuration, a single file is maintained with sections for each top level module's log information. Alternatively, some top level modules may be configured as to only provide inputs or other data to the DUT without any log recording capabilities.

The underlying principles of the present invention were derived from the observations that automated checking and error reporting in an ASIC verification effort generates a detailed, but cumbersome log of simulation. However, the log messages related to an error are most likely to be in a window of simulation time near the ERROR, rather than the full scope of the simulation time. The meaningful portion of log information is usually located close to the virtual window centered about the ERROR or trigger point. The window size can be large or small, depending on the nature of the bug, the type of simulation or other factors (also referred to as a trigger point or event).

FIGS. 2A, 2B, and 2C provide example log files from each of three top level modules (log file 1, log file 2, and log file n, respectively). Column 210 provides clock data (simulation cycle clock, or time stamp for example) that gives a reference instance an event. Event column 220 lists events, data, conditions, etc. that correspond to the instance specified by the clock data. Addition information may be provided in alternate columns (e.g., current state, test number, iteration, etc.).

Figure 3:
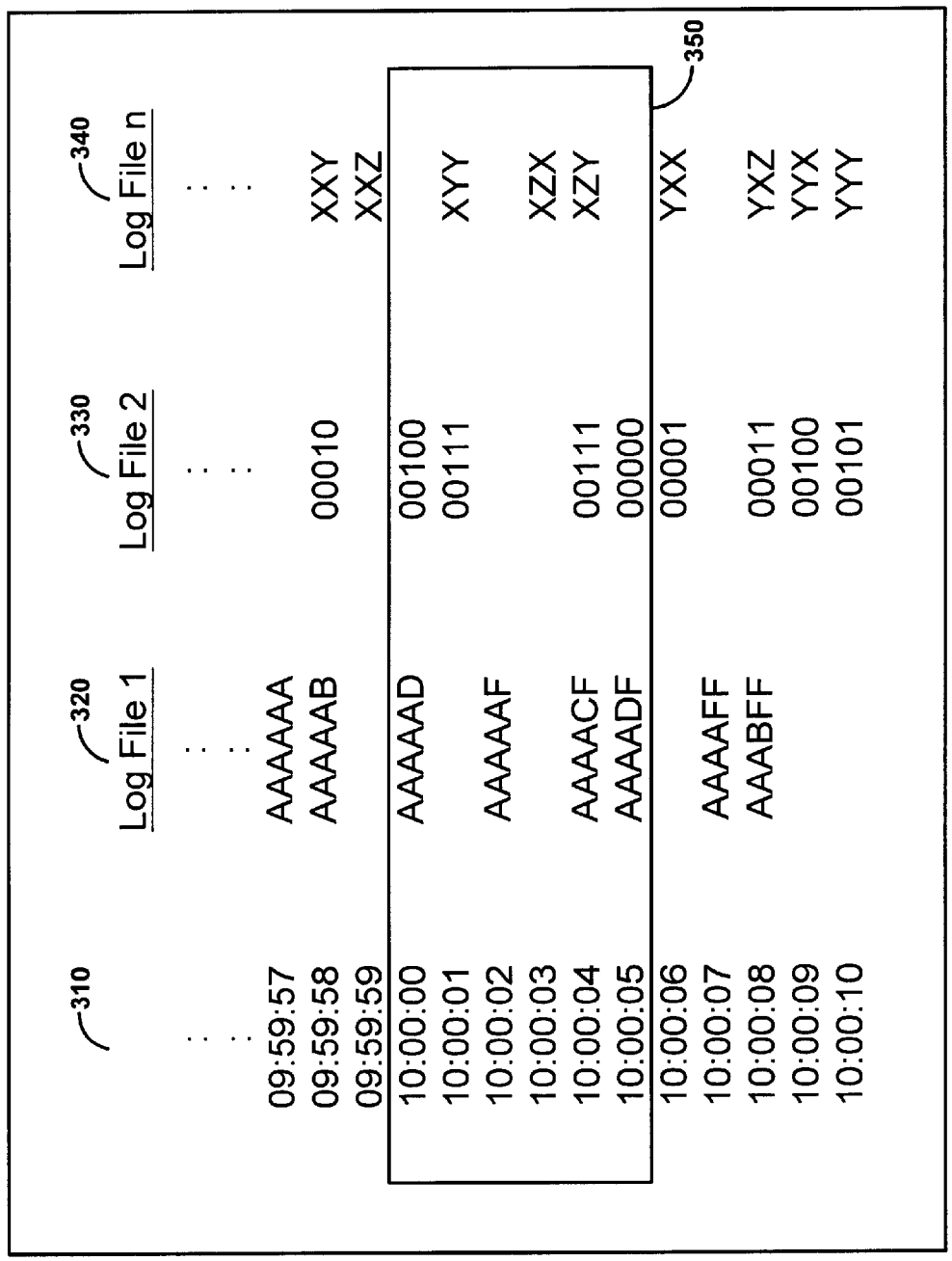
FIG. 3 is an example of a logical view and a window across separate module log files.

FIG. 3 illustrates a log file having a better logical view of the log information. Event information in each of columns 320, 330, and 340 are linked by sharing a same event sequence number or window number. A window 350, corresponding to a trigger log (clock data 10:00:05, for example), is shown surrounding relevant data at or near the triggering event (column 320 value="AAAADF," for example). Since the data at or near the triggering event is likely to contain all the necessary information for tracing bugs and other occurrences within the DUT, only the window needs to be saved to disk. This amounts to a small amount of data and disk I/O compared to logging and saving an entire simulation.

In one embodiment, the log file may be saved in a text format similar to window 350. However, as a practical matter, the log information will contain much more data than illustrated in the examples, and may not be well suited for illustration in a column format. FIG. 4 illustrates an example file content having the window data from each log file as shown in FIG. 3 stored in a single log file with event information from different modules at same time instances (same clock data) in adjacent rows, and ready for test engineer review. Additional windows of information may be saved to the file as the simulation continues.

In addition, besides the module that reports the trigger log, the verification effort is also likely to focus on log information of other related modules. Thus, synchronized disk save of all the virtual windows would help in determining the cause of the error. Again, the window size can be large or small, depending on the nature of the bug or other factors. Thus, when using separate files, each of the windows are saved at a same time in reference to the trigger event.

The new log mechanism can record log information in a circular memory buffer. The virtual window of log information will be saved onto the disk only when a trigger (ERROR) log information (event) is generated. Disk I/O operations can be largely reduced with the above log mechanism. The benefits of this mechanism are large, particularly at the stage of HDL regression testing, when HDL is stable and a bug (trigger) hit is less frequent. Besides, the circular buffer (window of log information) of each module needs to correlate with each other module in such a way that a hit of trigger log in one module can activate all the circular buffers to save that window of log information onto the disk.

Figure 5A:
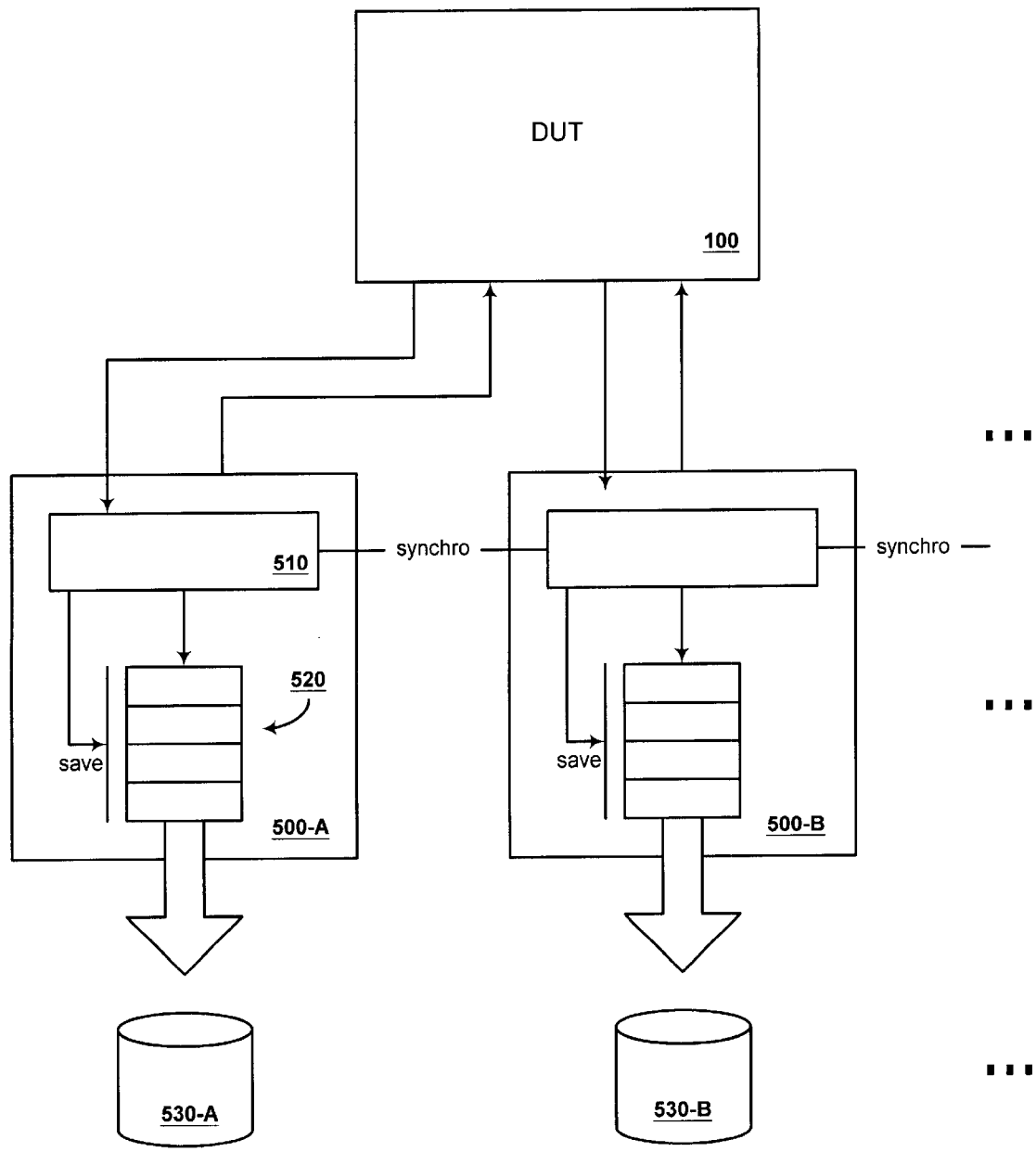
FIG. 5A is a block diagram illustrating synchronous saves of log information by multiple modules.

FIG. 5A is a block diagram illustrating synchronous saves of log information by multiple modules. The modules 500-A, 500-B, etc, each feed stimuli to the DUT 100. DUT responses and other conditions (log information) are retrieved the modules via a capture device 510 and forwarded to circular queue 520. The circular queue is constructed of a memory device (RAM, or a portion of memory allocated by a program, for example), and basically allows any amount of data to be written until the allocated memory is full. Once full, new data is accepted while the oldest data in the queue is discarded (LIFO). Other memory arrangements or data structures may be utilized (a linked list, for example).

The capture device includes a detector for identifying error and/or trigger conditions in the DUT responses and other conditions. Detectors of the various modules communicate with each other via a synchro line that allow each detector to share trigger information. When one module detects a trigger condition it is shared with the other modules, by initiating a save of the circular memory, or a window within the circular memory, to a storage device. The storage device may be a disk drive (530-A, as shown in FIG. 5A, for example), or may be another memory device suited for saving the log information contained in the circular memory. Disk Drives 530-A, 530-B, etc, may be a single disk drive or multiple individual drives. After saving to the disk drives, a collector program or other device may read the individual log files and compile the data into a single log file, such as that illustrated in FIG. 4, for example.

Figure 5B:
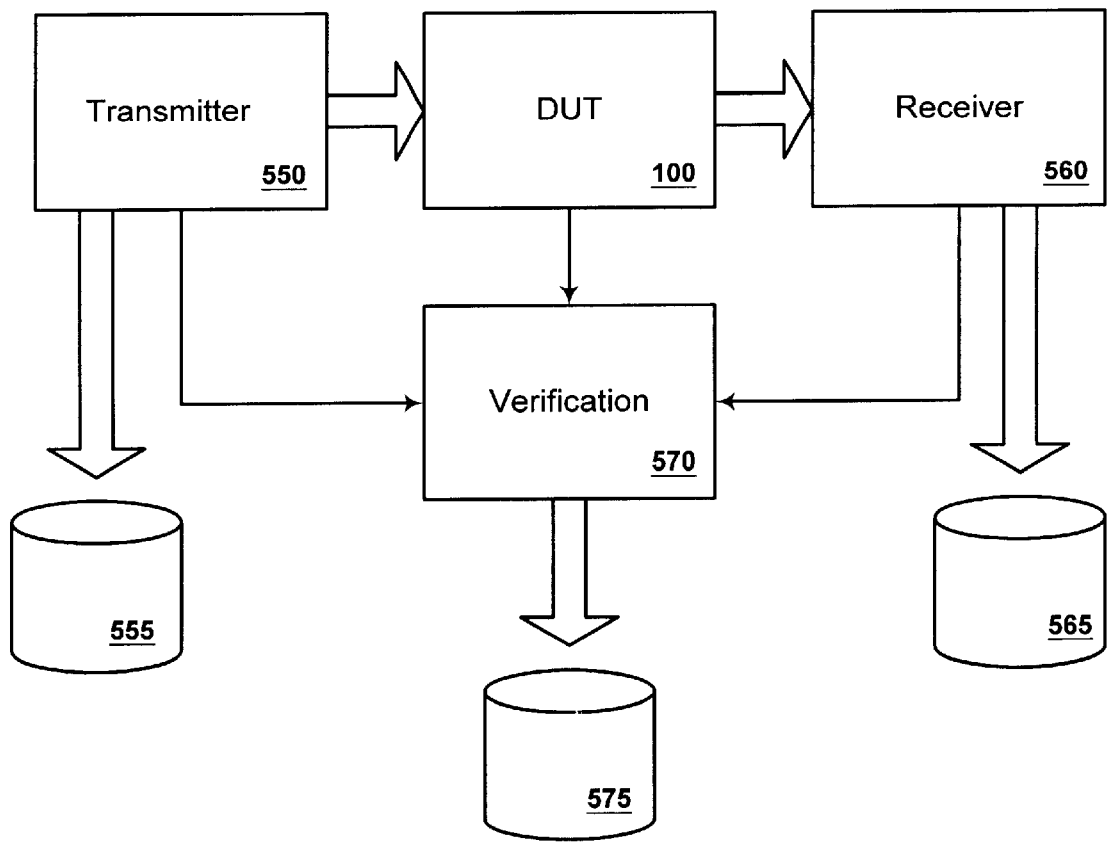
FIG. 5B is block diagram of an example test set-up for a DUT, including transmitter, receiver, and verification modules.

FIG. 5B is block diagram of an example test set-up for a DUT 100, including transmitter module 550, receiver module 560, and verification module 570. During testing, the transmitter module 550 sends stimuli to the DUT 100, and the DUT 100 sends data to receiver module 560. The verification module includes the features described for module 500-A, including a circular buffer and trigger mechanisms for writing a window of log information to disk. The verification module collects data from each of the DUT, transmitter, and receiver, and performs writes (to storage device 575) of log information upon occurrence of a trigger. Alternatively, each of the transmitter and receiver modules may also contain the buffer and trigger mechanisms and perform writes (to storage devices 555 and 565 respectively) of log information upon occurrence of the same trigger. Storage devices 555, 565, and 575 may be separate disk drives, or the data may be combined and written to a single disk drive or other storage device.

Figure 6:
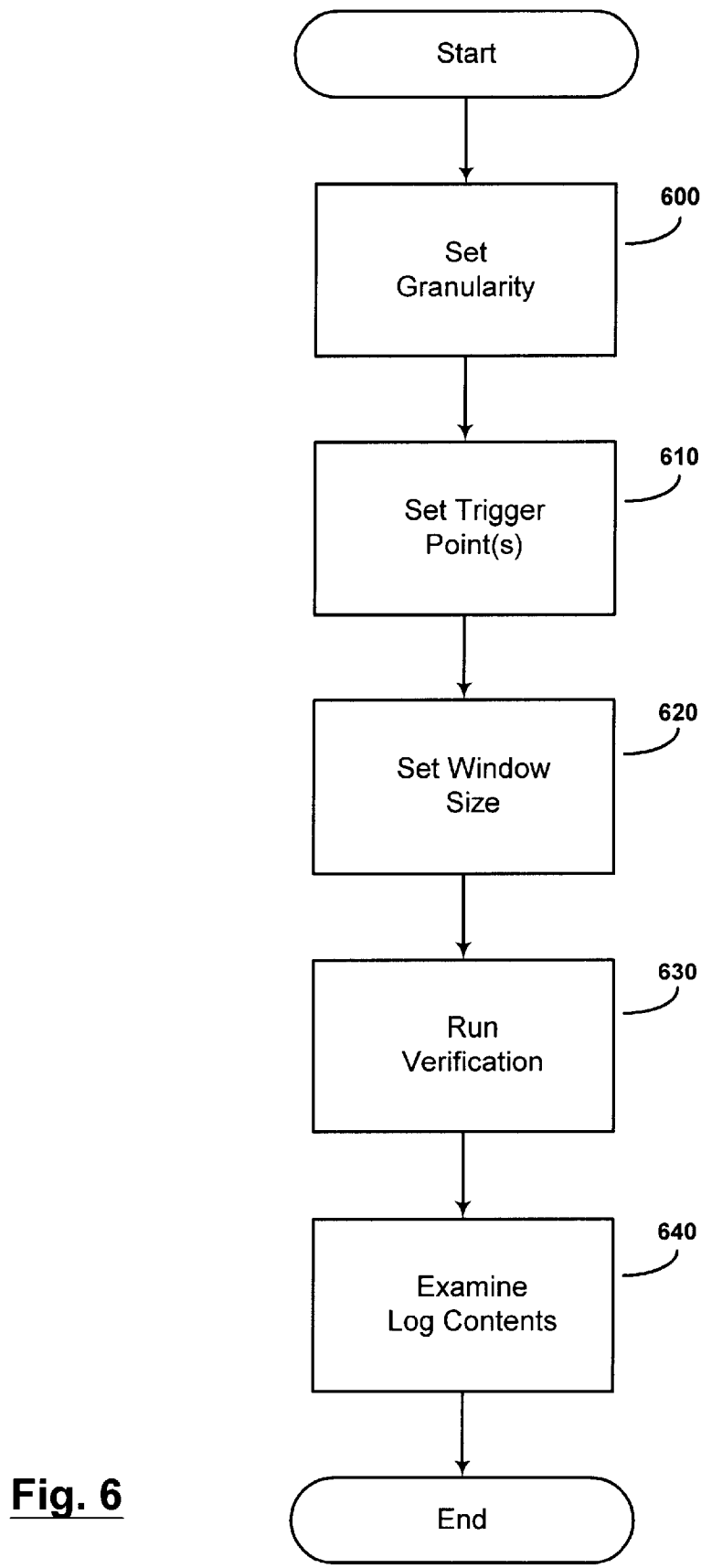
FIG. 6 is a flow diagram for setting up the invention and a verification process.

FIG. 6 is a flow diagram for setting up the invention and a verification process. After setting up the DUT an associated modules (See FIG. 1, for example), the test engineer sets a level of granularity for log information, trigger points, and a window size (steps 600–620). The granularity defines how much log information is recorded (all log information, some fraction of available information, etc.), log information may only show execution of high level functions, or may be as detailed as providing information about each clock cycle in the simulation). The granularity level is a first balance that determines the size of the log file, more granularity resulting in more information that potentially needs to be captured by the log file. The window size determines how much log information will actually be stored in the circular buffer before new information displaces older information. The window size also defines an upper range for the amount of data that will be saved in the log file for each occurrence of a trigger point. The trigger points identify DUT conditions or errors that will trigger a write of the circular buffer (circular queue) to the log information file. The window size may change dynamically based on the type of bug, or the error encountered. For some error, just a few cycles of information may be required to diagnose the error, while other may need hundreds or thousands of cycles for a complete diagnosis. Thus, when setting the window size, the verification engineer may select different sizes for each type of error condition. A default window size may be established for each error type that may be altered by the engineer in step 620. More or less cycles will applied to the window size depending o the nature of the problem being diagnosed.

The granularity level may be set by selecting one of a set of partitions. Any number of partitions establishing granularity level may be provided. In one embodiment, partitions are set for each of ERROR, WARNING, ALERT, and VERB. Error indicates that an error condition has occurred within the DUT. WARNING indicates that results or other parameters are out of range or other conditions indicate that an error has occurred or is likely to occur. ALERT indicates that undesirable conditions are present in either the DUT or other modules. And, VERB indicates high level description of functions being performed or tested. With each partition, a greater detail of information is provided (for example, a set of cycle based transactions performing a bus read, are identified as "BUS READ," rather than providing all the details of each cycle—e.g., bus arbitration, handshaking, etc, additional information that would otherwise make the log information file much larger). Setting the granularity then, if a test/verification engineer sets the granularity to Warning, may provide that only ERROR and WARNING data and conditions are given to the log information (sent to the circular queue). In contrast, if the granularity selected in VERB, then all ERROR, WARNING, ALERT, and VERB information is provided as log information.

Alternatively, the test/verification engineer can pick and choose between the partitions, for example, selecting only ERROR and VERB, in which case only error conditions along with high level functional descriptions will be provided as log information. In another alternative, the log information may include data for each cycle (hence, a partition option called CYCLE) regardless a function being performed, or any error, warning, or other conditions that those cycles may indicate.

The granularity may be set for all the log files with a single declaration (ERROR, or VERB for all log files, for example), or, the granularity may be set for each module and a corresponding log file individually (for example, in one module the engineer may be only interested in functional information, and set the granularity to VERB, while another module may need detailed cycle based information and the granularity in that module would be set to CYCLE). In addition, each module may have multiple log files, and the partition level may be set differently for each of the multiple log files in any one module.

The partition level may also be set during run time (run time flexibility). For example one log file for a module may be set to VERB, but at different places in the simulation (upon execution of a certain test, or upon occurrence of a certain condition, for example) the partition or granularity of recording the log information may be changed. The structure of modules generally includes one or more blocks or sub-blocks (a hierarchical structure), each performing one or more tests, or parts of a test. When the granularity of an upper level (the whole module, or an upper level block) is set, each lower level block inherits the granularity setting of the level above (the upper level defining a default granularity for a block or sub-block). However, the lower level blocks or sub-blocks may also be set with its own granularity. In addition, the user may set a number of cycles to be included in the log information before or after the occurrence of a trigger, or set the trigger to occur at the middle of the window (in which case the write to disk occurs a predetermined number of cycles after the trigger event).

At step 630, the verification is run. As discussed above, the verification consists of applying stimuli by the top level modules to the DUT in it's test environment, and the collection of log information from the DUT. The collected log information is then placed in a file, and, depending on the implementation, the log information may be grouped, categorized, or otherwise organized to provide an efficient view of the log information. At step 640, the contents of the log information are examined by the test or verification engineers.

Figure 7:
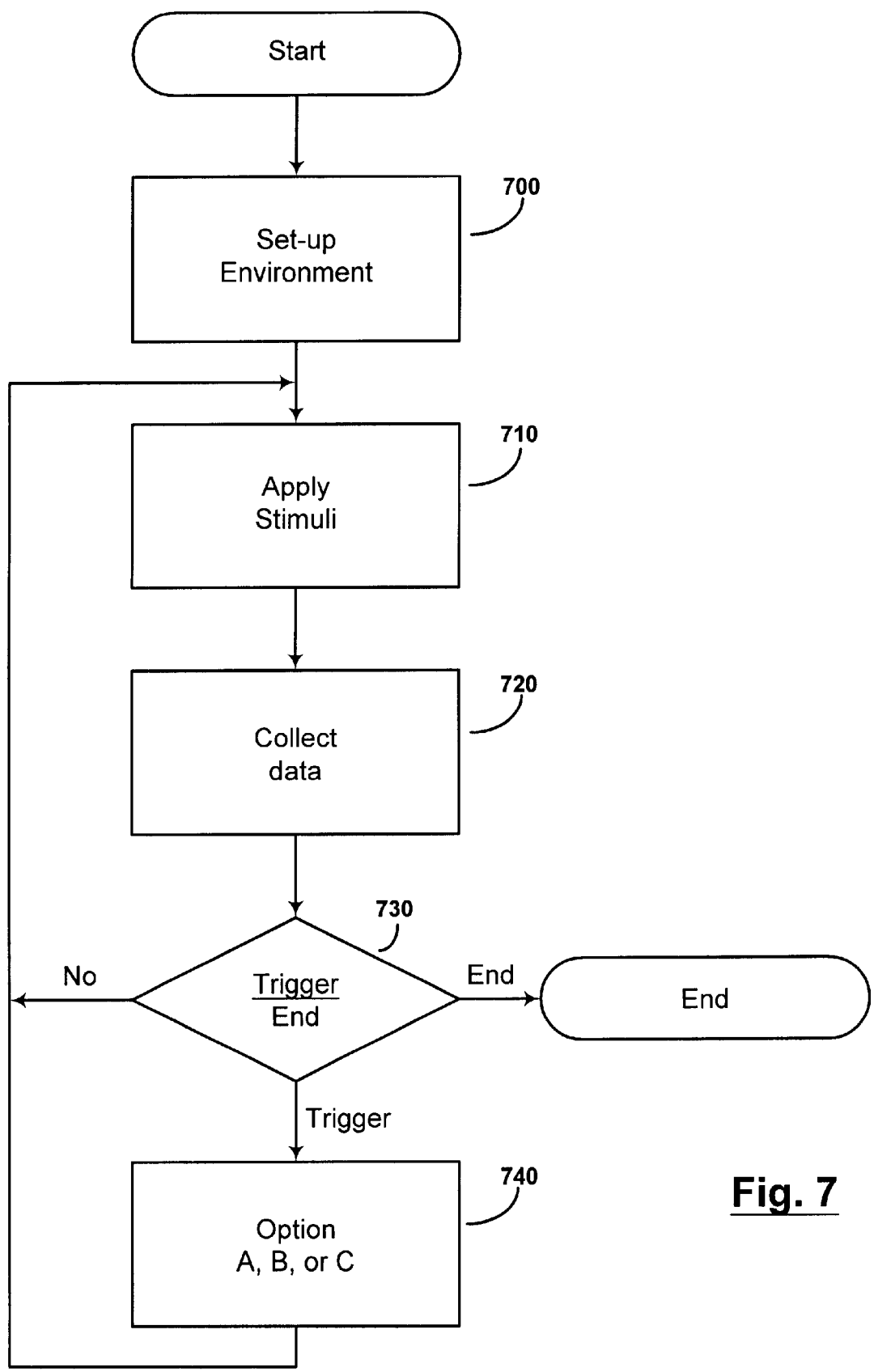
FIG. 7 is a flow diagram of a verification process.

FIG. 7 is a flow diagram of a verification process. After setting up the environment, top level modules apply stimuli (step 710), and collect data from the DUT (step 720). At step 730, the data collected is evaluated to determine if a trigger has occurred. If a trigger is detected, the log information is saved (step 740). If the simulation is completed, the process stops.

Figure 8:
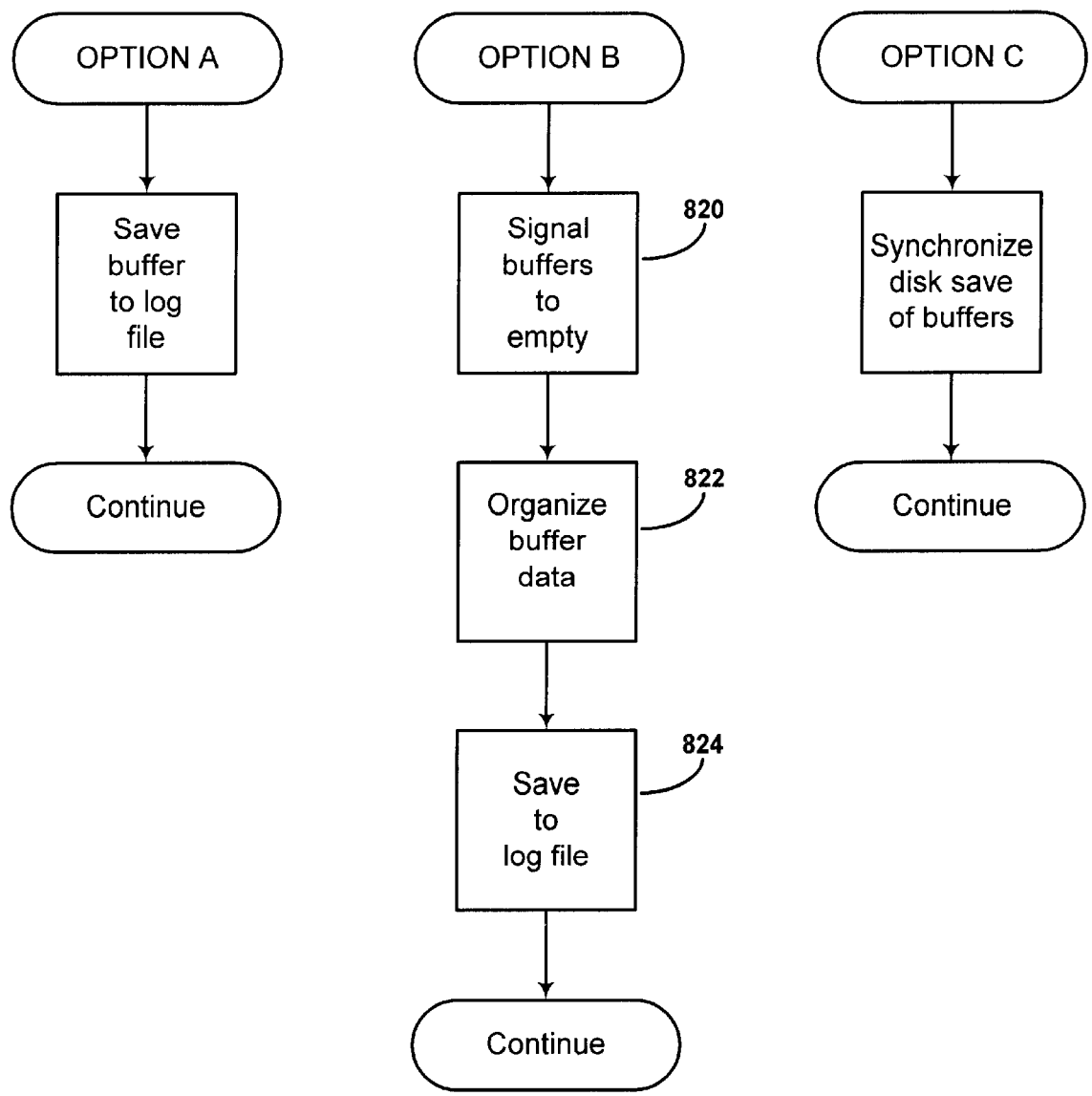
FIG. 8 is a set of flow diagrams illustrating 3 possible options for saving log information after a trigger.

Step 730 includes saving the log information stored in the queue (circular queue, for example). Based on the present disclosure, many different options will be apparent to those skilled in the art for saving log information. FIG. 8 provides 3 options for saving the log information upon a trigger event. Option A is a simple save of the buffer (circular queue, for example) to a log file. A simple save may include multiple log files (one for each top level module). Option C may also include multiple log files, but includes a synchronization step such that each of buffers from the top level modules are saved synchronously. In Option C, it is worthwhile to have similar window sizes set up where possible for easier matching of information recorded in the multiple log files.

Option B may also include a synchronous save. At step 820, a signal indicates a save of the buffers (circular queues for each top level module). Each buffer is emptied and saved to a log file (step 824). As an intermediary step (step 822), or after the save to the log file, the log information from each of the buffers may be organized for easier searching and correlation of data from each of the top level modules.

The present invention is advantageously implemented in an object-oriented program environment. In one implementation, a structure of a Log Module Class, as illustrated in Table 1, is utilized. The Log module consists of:

1). A File pointer to the log file, opened for save log information;

2). A Circular buffer, that buffers the log information; and

3). A Synchronization State machine, that communicates with the Synchronization state machine of other objects of log class.

As with all example code portions contained herein, Table 1 is not intended as a compilable or executable portion of code, but instead serves as one example of program flow, code, or structure for an implementation of the present invention. To those skilled in the art, many variations of the code portions may be produced based on the present disclosure. Therefore, table 1 should not limit the invention, as it is provided for exemplary purposes.

TABLE 1

```
/*Declare enumerate type */
enum Priority = VERB, ERROR, ALERT, WARN;
enum States = Log_IDLE, Log_ACCU, Log_TOFILE,
Log_DUMPALL,
Log_POSTFILE;
class Log {
    /* local (or private) variables, that just used by this object */
    local Priority PriorityLevel;    // log information priority level
    local States Smstate             // state machine variabie
    local integer WindowSize         // progrmmbable
    local string strBuf[];           // associated array of circular buffer
    local string fileName, fstr;     // filename of log file to save onto disk
    local bit LocalSync, DumpEverything;
    locai integer filePtr = Om i, k, Initiator = 0, LocalBufCnt = 0;
    /* static fieid is shared by all objects of Log class,
    intercommunication is implemented */
    static string ErrorString, InitNameShared;
    static integer ErrorSessionCnt, AlertSessionCnt,
    WarningSessionCnt, SessionCnt;
        Static bit BuffSync = 0;
        Static integer SempahoredId; //samaphore to control the static
        fields
        /* filename, windowsize are programmable, DumpEveryLine is the
        nobe to bypass tne buffer management and save every line onto disk
        directly */
        task new (string fname, integer WindowSzb = 1000, bit
        DumpEveryLine);
        /*this is one function tnat is to be called by user, user decides
        log information priority based on tne application, FilePtrl and
        FilePtr2 are optional for user to cross print the log information into
        other related objects of class Log */
        public task LogPrint( Error FoundError = VERB,
                              integer FilePtr1 = 0,
                              integer FilePtr2 = 0,
                              String Str
                              );
public task Debug(); //for developer to debug
public function integer getFiiePtr(); //provide read-only
/* access to file pointer */
local task WindowPrint( Error FoundError = VERB,
                        integer FilePtr1 = 0,
                        integer FilePtr2 = 0,
                        string str
                        );
} //End of Log class declaration
```

The log module includes local variables are defined for each of log information granularity, state machine (synchronization between each log file—an error event triggered in one module, or for one log file, triggers recording in each log file), window size, circular buffer, and the log file name. In addition, utilities to do log recording (LogPrint, used by each module, to send log information to the circular queue), file utilities (getFilePtr), debug (for development uses—the modules will generally not use this function), and WindowPrint which provides the ability for a module to save the window to disk.

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, microdrive, and magneto-optical disks, ROMs, RAMs, EPROMs, EEPROMs, DRAMs, VRAMs, flash memory devices (including flash cards), magnetic or optical cards, nanosystems (including molecular memory Ics), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, setting up verification environment variable, applying stimuli to a DUT, maintaining a window within one or more test modules, collecting log information, organizing and writing log information within each window based on one or more trigger points, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A method of collecting log information for a Device Under Test (DUT), comprising the steps of:
   setting up an environment of operating conditions for the DUT;
   applying at least one test stimuli to the DUT;
   collecting log information from the DUT that results from said environment and the applied test stimuli; and
   saving the log information in a log information file,
   wherein said step of collecting log information includes the step of temporarily storing the collected log information in a queue;
   said step of collecting comprises collecting log information for multiple modules; and
   said step of saving comprises the step of synchronously saving the collected log information to corresponding log information files.

2. The method according to claim 1, further comprising the step of maintaining a window of said log information in said queue.

3. The method according to claim 2, wherein said window comprises at least one of an amount of said log information equal to a size of said queue, a predetermined number of log information entries, a predetermined span of time, and a predetermined number of cycles.

4. A method of collecting log information for a Device Under Test (DUT), comprising the steps of:
   setting up an environment of operating conditions for the DUT;

applying at least one test stimuli to the DUT;

collecting log information from the DUT that results from said environment and the applied test stimuli; and saving the log information in a log information file, wherein:

said step of collecting result data comprises collecting log information from multiple modules; and said step of saving the log information comprises synchronously saving the result data collected from each module to said log information files.

5. The method according to claim 4, further comprising the step of organizing the collected log information according to time of occurrence.

6. The method according to claim 4, further comprising the steps of:

recognizing a trigger point, and initiating said step of saving the log information based on occurrence of said trigger point.

7. The method according to claim 6, wherein said trigger point comprises occurrence of at least one of an ERROR, WARNING, ALERT, and VERB.

8. The method according to claim 6, further comprising the step of:

performing, continuously, said steps of applying and collecting, until a trigger, and then saving the log information;

wherein said step of performing is repeated until a predetermined set of verification tests are performed on the DUT.

9. A log information mechanism for a Device Under Test (DUT), comprising:

at least one test module connected to said DUT, each test module comprising, a circular buffer to store data regarding tests performed on said DUT, a trigger mechanism configured to, identify trigger events, and save of at least part of the data stored in said circular buffer upon occurrence of a trigger event; and a linking mechanism configured to link each trigger mechanism of each test module so that the saves performed by each test module are performed synchronously.

10. The log information mechanism according to claim 9, further comprising:

an organization device configured to organize the data saved from each module in a logical format so that related events in different modules are tied together.

11. The log information mechanism according to claim 9, wherein said trigger events include any of at least Error Conditions, Warnings, Alerts, and High level functional descriptions of conditions or operations occurring in said test modules or the DUT.

12. The log information mechanism according to claim 9, wherein said data regarding tests comprises any of outputs from said DUT and conditions of said DUT, including but not limited to any of error conditions and warnings.

13. The log information mechanism according to claim 9, wherein said circular buffer is a memory device configured as a FIFO.

* * * * *